United States Patent [19]

Babinski

[11] Patent Number: 4,651,252

[45] Date of Patent: Mar. 17, 1987

[54] TRANSISTOR FAULT TOLERANCE METHOD AND APPARATUS

[75] Inventor: Thomas E. Babinski, Kenosha, Wis.

[73] Assignee: Eaton Corporation, Cleveland, Ohio

[21] Appl. No.: 717,335

[22] Filed: Mar. 29, 1985

[51] Int. Cl.⁴ .............................................. H02H 3/08
[52] U.S. Cl. ........................................ 361/93; 361/86; 361/91; 361/101; 361/87
[58] Field of Search ...................... 361/86, 87, 88, 91, 361/93, 101; 330/207 P, 298

[56] References Cited

U.S. PATENT DOCUMENTS

| | | | |
|---|---|---|---|
| 3,526,846 | 9/1970 | Campbell | 330/298 |
| 3,536,958 | 10/1970 | Sondermeyer | 330/298 X |
| 3,845,405 | 10/1974 | Leidich | 330/298 |
| 4,338,646 | 7/1982 | Davis et al. | 361/91 X |
| 4,375,074 | 2/1983 | Glogolja | 361/91 |
| 4,491,744 | 1/1985 | Corey | 307/270 |
| 4,494,164 | 1/1985 | Noel | 330/207 P |
| 4,525,765 | 6/1985 | Brajder | 361/86 X |
| 4,538,198 | 8/1985 | Imanishi et al. | 361/87 X |

Primary Examiner—A. D. Pellinen
Assistant Examiner—Derek S. Jennings
Attorney, Agent, or Firm—Watts, Hoffman, Fisher & Heinke Co.

[57] ABSTRACT

A power transistor control circuit for controlling the bias input to the power transducer. During normal operations two switching transistors bias the base input to a power transistor positively and negatively to turn the power transistor on and off. By back biasing a conducting transistor, however, the blocking voltage capability of the transistor is diminished. To maintain blocking voltage at a maximum, the present circuit senses overcurrent conditions indicating a problem condition exists and turns off the power transistor by neutrally biasing a base input. Preferably, both switching transistors used to bias the base input during normal operation of the transistor are rendered nonconductive to accomplish this neutral biasing.

9 Claims, 4 Drawing Figures

TRANSISTOR FAULT TOLERANCE METHOD AND APPARATUS

TECHNICAL FIELD

The present invention relates to transistor biasing and more particularly to method and apparatus for maximizing a transistor's fault tolerance.

BACKGROUND ART

One application for power transistors employed in the prior art is use in an inverter to invert direct current electrical power to single or polyphase alternating current power. The power transistor performs such an inversion by switching the D.C. power in sequence to different alternating current output connections. Such a sequential switching operation is controlled by a logic circuit which supplies electrical pulses to the power transistors to render them conductive or nonconductive. Upon being driven into conduction by a signal from such a logic circuit, the transistor either conducts for a fraction of a cycle and is then turned off in a controlled manner to pulse width modulate the alternating current output or conducts with a 50% duty cycle and the D.C. voltage is varied (VVI).

Prior art power transistor driver circuits are designed with both forward and reverse biasing capability. A power circuit base drive circuit applies bias control for fast switching times under normal operation. The base drive circuit biases the power transistor in one biased state or the other, i.e. either forward or reverse biases the power transistor.

Optimization of such power circuits makes the power transistors susceptible to damage when exposed to over-current conditions. Such overcurrent conditions typically result in either an avalanche breakdown condition or punchthrough of one of the p-n junctions comprising the transistor.

In the event of an overcurrent, it is necessary to remove a forward bias and turn the transistor off and avoid either condition. In the prior art, a reverse bias is applied to turn off the transistor. Application of a reverse bias to the transistor's base input reduces or limits the transistors ability to withstand over-voltage conditions that accompany an overcurrent condition caused by transients and the like.

One prior art solution to this over-voltage problem is use of resistor/capacitor snubber circuits coupled across a power transistor. These snubber circuits limit the rate of change of the voltage across the power transistor. This solution, however, typically results in problems in mounting these components in the power circuits and results in additional cost as well as power losses within the circuit. Snubber circuits also reduce the turn-on capability of the power transistor and therefore slows response time of the power circuit.

DISCLOSURE OF INVENTION

The present invention concerns a method and apparatus to control biasing conditions of a transistor during an overcurrent situation. The invention eliminates the need for snubber components while increasing the voltage the transistor can withstand before failure.

The circuitry of the invention includes a switching circuit for forward and reverse biasing a control input to a transistor to cause that transistor to conduct and stop conducting under control of the switching circuit. A sensing circuit is coupled to the transistor for sensing a potential failure condition in that transistor. This is accomplished by sensing either current through the transistor or voltage across the transistor. Additionally, the invention includes a control circuit coupled to the sensing circuit to deactivate the switching circuit and neutrally bias the control input to the transistor in the event a failure condition is sensed.

Neutral biasing of the control input to the transistor allows the transistor to withstand greater breakdown voltages than a reverse biased transistor. Under normal circumstances, when the power transistor is not subject to potentially damaging voltages, the switching on and off of the power transistor is accomplished as in the prior art. The control input is forward biased when conduction is required and reverse biased to turn off the power transistor. Only in an over-current condition, is it necessary to maximize voltage blocking by neutrally biasing the control input.

A preferred embodiment of the invention includes two switching transistors coupled to a base input of a power transistor. A first switching transistor having a control input at its base, turns on the power transistor by applying a first polarity signal to the base of power transistor. When the transistor is to be reverse biased, a second switching transistor applies an opposite polarity signal to the base of the power transistor. As noted above, so long as potentially damaging voltages are not experienced, these two switching transistors control power transistor operation. When an over-current condition is sensed, however, a control circuit biases both switching transistors out of conduction to bring the base input to the power transistor to a neutral voltage. This turn-off mode for the power transistor differs from the normal turn-off in that it allows the collector current of the power transistor, rather than a reverse bias current, to sweep charge carriers from the base of the power transistor. This results in a greater voltage handling capability at high currents to prevent breakdown of the transistor.

Alternate embodiments of the invention sense either current or voltage through or across the power transistor. Each embodiment, however, interacts with control logic used to turn on and off the power transistor under normal circumstances. Details of this operation will be disclosed in conjunction with discussion of a preferred embodiment of the invention. One object of the invention is improved voltage protection for a transistor by controlling turn-off of the transistor. This and other objects, advantages and features of the invention will become better understood when a detailed description of a preferred embodiment of the invention is described in conjunction with the accompanying drawings.

BEST MODE FOR CARRYING OUT THE INVENTION

Figure 1:
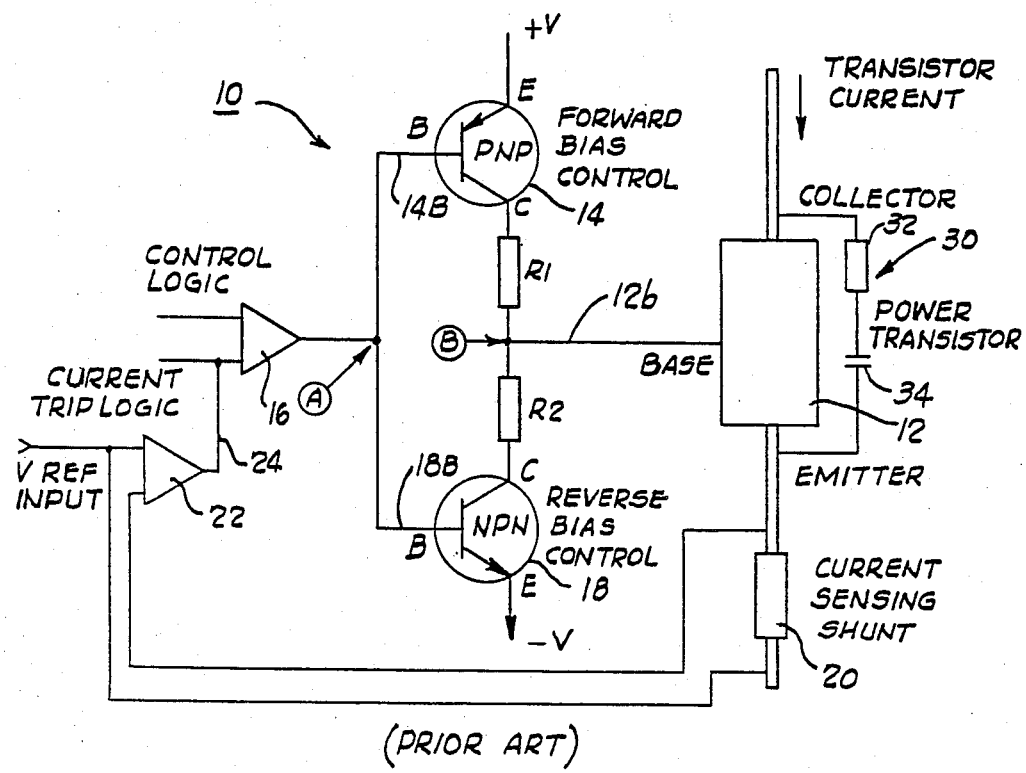
FIG. 1 is a schematic of a prior art control circuit for turning on and off a power transistor.

Referring now to the drawings, FIG. 1 illustrates a prior art control circuit 10 for turning on and off a power transistor. One application for such a circuit 10 is for control switching on and off of the transistor to convert a direct current input into a pulse width modulated alternating current output. The operation of the prior art circuit 10 will be described briefly to facilitate understanding of the embodiments of the invention shown in FIGS. 3 and 4.

The circuit 10 is seen to include a power transistor 12 having base, emitter and collector portions as labeled in FIG. 1. The particular power transistor 12 shown in FIG. 1 is an NPN transistor so that application of a biasing voltage at the base input 12b creating a sufficient potential difference between base and the emitter will bias the transistor 12 into conduction. This forward biasing signal is provided by a switching transistor 14 having a base control input 14b. The input 14b is coupled to a control logic circuit 16 having an output coupled to the base 14b. When this output goes "low" the switching transistor 14 is biased into conduction, and the base input 12b to the power transistor rises toward the V+ power supply and is biased into conduction.

A second switching transistor 18 reverse biases the base 12b to turn off the power transistor. This second switching transistor 18 also has a base input 18b coupled to the output from the logic circuit 16. A "high" output signal from the logic control circuit 16 biases the second switching transistor 18 into conduction and turns off the first switching transistor 14. With the second transistor conducting, the base input to the power transistor is pulled negative thereby reverse biasing the base emitter junction and turning off the power transistor 12.

A current sensing shunt 20 is seen coupled to the emitter of the power transistor 12. The shunt 20 senses overcurrent conditions caused by the transients and the like passing through the transistor. A comparator amplifier 22 senses an output from the current shunt 20 and compares the voltage differential across the shunt 20 to a threshold or reference value. An output 24 from the amplifier 22 changes state when this difference exceeds the reference. This change of state, causes the logic circuit 16 to turn on the reverse bias switching transistor 18 and turn off the power transistor 12.

One additional feature of the FIG. 1 circuit 10 is the resistor capacitor network 30 having a resistor 32 and capacitor 34 coupling the power transistor collector to emitter. The RC network 30 is advantageous from a protection standpoint but tends to inhibit transistor performance since high speed switching is impeded and fabrication of the circuit 10 made more difficult.

Figure 2:
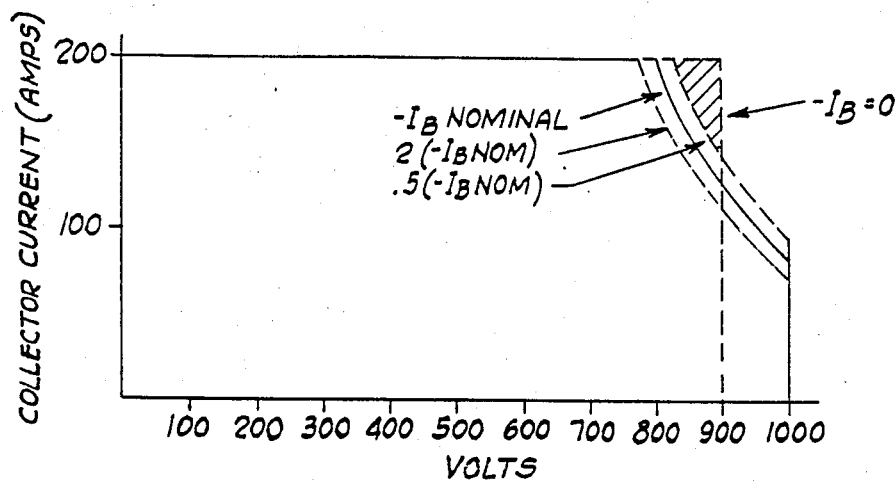
FIG. 2 is a graphical representation showing a relationship between collector current and voltage across a power transistor for different base currents.

Turning now to FIG. 2, the rationale for the present invention is discussed. The ordinate axis in FIG. 2 represents collector-emitter current and the abcissa is the breakdown voltage of the power transistor in volts. Four functional relationships between these two quantities are shown in FIG. 2. The base current relationships embodied by the three parallel curves indicate that at high currents and reverse bias conditions, the breakdown voltage of the power transistor degrades. For a nominal reverse bias base current, the ability of the power transistor to withstand high voltages decreases more than 10% for a collector-emitter current of 200 amperes.

The vertical line corresponding to a zero volt base-emitter bias at the base input shows an improvement in the voltage withstanding capacity in the high current region. One aspect of the present invention is to turn off the power transistor in a way that is most efficient during normal operating conditions yet which produces the greatest resistance to breakdown voltage during occasional perturbations in the voltage across (and thus current through) the power transistor.

Figure 3:
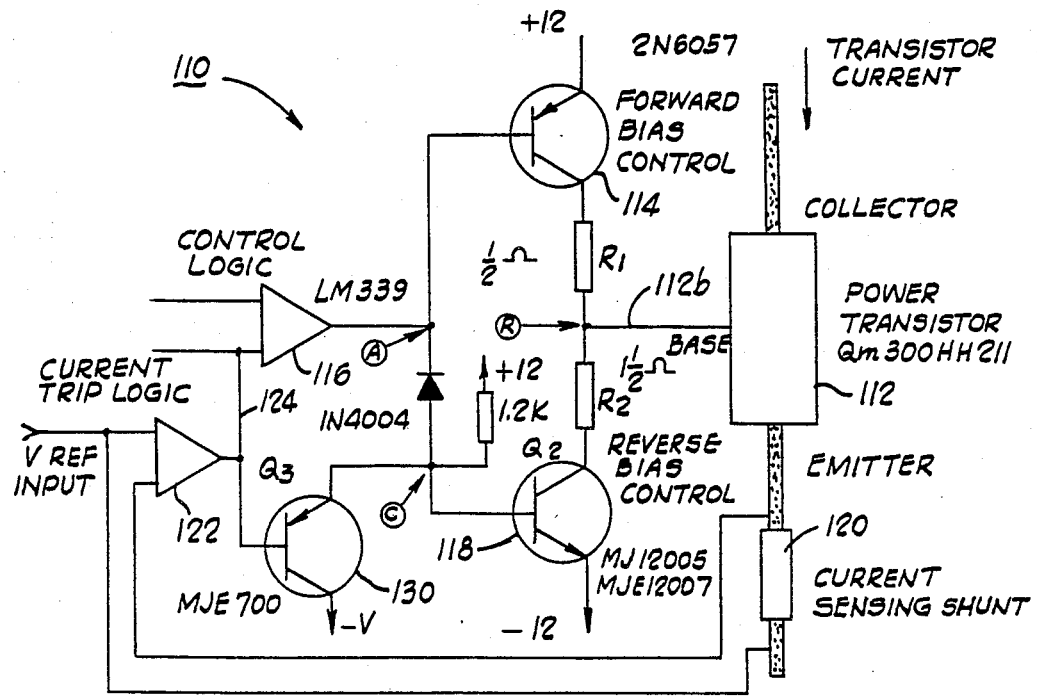
FIG. 3 is a schematic of a control circuit for turning on and off a power transistor having components for sensing overcurrent conditions in the transistor and controlling turn-off under these circumstances.

Turning now to FIG. 3, one embodiment of a control circuit 110 of the invention is illustrated. This circuit 110 includes a power transistor 112 and two switching transistors 114, 118. The conduction of the two switching transistors 114, 118 under normal operating conditions is controlled by a logic circuit 116 having a control output connected to the base of each switching transistor. Under normal circumstances, the two switching transistors 114, 118 are biased into conduction to control the base input 112b of the power transistor in a manner identical to the functioning of the circuit 10 shown in FIG. 1.

The FIG. 3 circuit 110 also includes a shunt sensor 120 for monitoring current passing through the power transistor. A comparator amplifier 122 responds to the voltage across the shunt 120 so that when the voltage exceeds a threshold value an output 124 from the amplifier 122 changes state. When an over current condition occurs, the voltage across the shunt 120 rises and the circuit 110 turns off both switching transistors 114, 118. This is accomplished by controlling the two junctions labeled "A" and "C" in FIG. 3.

An over-current condition sensed by the current shunt 120 causes the control logic circuit 116 to pull the "A" point high turning off the switching transistor 114. This is in response to a low output from the comparator amplifier 122. A low output from the amplifier 122 causes a third switching transistor 130 to conduct and pull the point "C" low thereby turning off the second switching transistor 118. Both transistors 114, 118 are now nonconducting and the bias point "B" will reach a value intermediate the positive and negative voltage sources, i.e. approximately zero volts. This zero volt bias turns the transistor 112 off while maximizing the voltage handling capacity of the transistor at a voltage above the voltage it can withstand under reverse bias.

Figure 4:
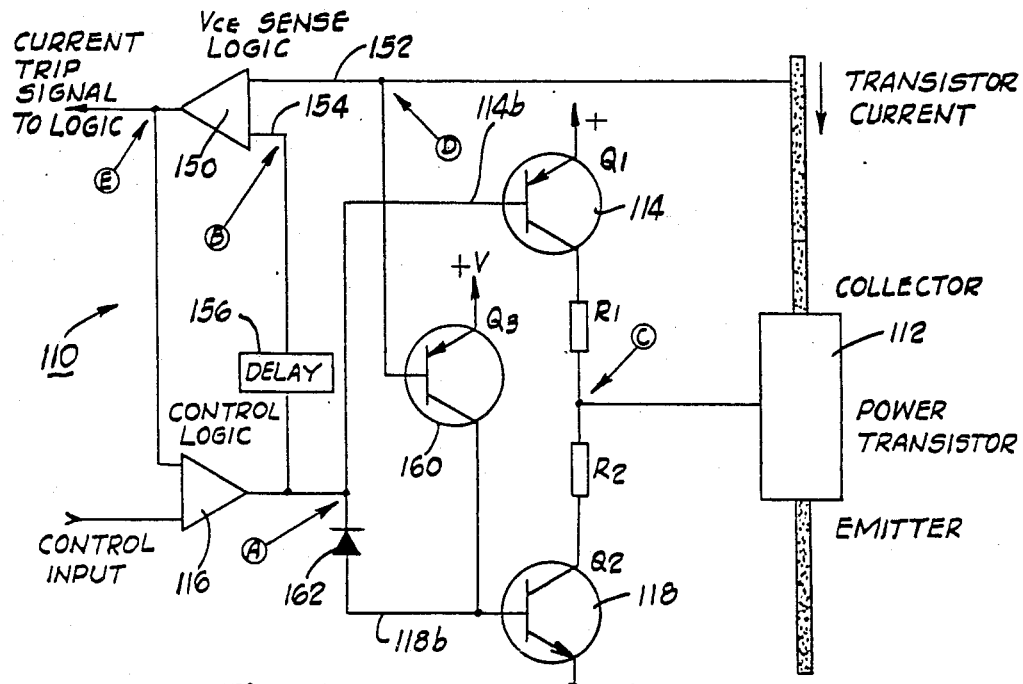
FIG. 4 is an alternate embodiment of the invention having a circuit for sensing voltage across the transistor and turning off the transistor in a controlled manner.

FIG. 4 illustrates an alternate embodiment of the invention. Like reference numerals have been used for like elements in the FIG. 4 circuit. This circuit 110 differs from the FIG. 3 design by sensing the collector to emitter voltage (Vce) instead of the current passing through the transistor. During normal circuit operation, a control circuit 116 applies control inputs to the base inputs 114b, 118b to switch on and off the two switching transistors 114, 118.

During switching operations, a comparator circuit 150 must be disabled. When the power transistor 112 is turned off, a first input 152 to the comparator circuit 150 will be high and it is necessary that a second input 154 (point "B") also be high to avoid producing a low output from the circuit 150. When the control circuit 116 produces a low output to turn on the power transistor 112, this low signal is delayed by a delay line 156 until the voltage across the transistor 112 has dropped a sufficient amount that the difference between the inputs 152, 154 does not produce an output from the comparator circuit 150.

Reverse biasing under normal operation is achieved by the switching transistor 118 working in combination with an additional switching transistor 160. The control circuit 116 pulls point "A" high to turn off switching transistor 114. Once point "A" goes high, a diode 162 allows the transistor 160 to pull the base input 118b to the switching transistor 118 high. This turns on the transistor 118 and pulls the voltage at the point "C" at the base of the power transistor low thereby back biasing the base emitter junction and turning off the power transistor 112. As the power transistor 112 goes out of conduction, the transistor 160 turns off thereby turning off the transistor 118. The inherent circuit delay of the back biasing transistors 160, 118 is sufficient, however, to insure that reverse bias remains at the base of the power transistor until the transistor has fully turned off.

During an overcurrent condition the power transistor's collector-emitter voltage level will rise as the current rises above the power transistor's saturation point. As soon as this voltage rises a sufficient amount, the voltage differential across the inputs 152, 154 to the comparator circuit 150 will change an output state at point "E" in FIG. 4 which in turn causes the control circuit 116 to force point "A" positive. This turns off the transistor 114. A point "D" coupled to the base of the transistor 160 has already risen in response to the over-voltage condition, however, so that the transistor 160 is no longer conducting and therefore the high signal at high point "A" cannot turn on the transistor 118. The point "C" in FIG. 4 is not back biased but instead is neutrally biased at a voltage midway between the voltage sources (approximtely zero) which is sufficient to turn off the power transistor 112 without degrading its blocking voltage capacity.

Representative values for the transistors and other components have been illustrated in FIG. 3. It should be appreciated however that the invention can be practiced using other circuit configurations with other circuit components. It is the intent therefore that the invention include all such modifications or alterations falling within the spirit or scope of the appended claims.

I claim:

1. A method in controlling the operation of a power transistor by adjusting a bias voltage across a base-emitter junction of said power transistor comprising the steps of:
   providing positive and negative biasing potentials for controlling a bias potential at a base input to said power transistor;
   forward and reverse biasing said base input to turn on and off said power transistor during normal transistor operation by selectively coupling one of said positive and negative biasing potentials to said base input;
   monitoring operation of said power transistor to sense a failure condition of said power transistor; and
   neutrally biasing said base input in the event a failure condition is sensed to turn off said power transistor without reverse biasing said base-emitter junction to maximize a voltage blocking capability of said transistor as charge carriers are swept from the base of said transistor as part of a collector current.

2. The method of claim 1 wherein the monitoring step is performed by monitoring a current flow through the transistor.

3. The method of claim 1 wherein the monitoring step is performed by monitoring a voltage across the transistor.

4. Circuitry to control conduction of a power transistor comprising:
   positive and negative power supply means for applying positive and negative potentials to a base-emitter junction of said power transistor;
   first and second switching means for coupling one of said positive and negative power supply means to a base input of said transistor to bias said transistor to conduct and to stop conducting;
   sensing means for sensing a potential failure condition in said transistor; and
   control means coupled to said sensing means to deactive the first and second switching means and neutrally bias said base input at a voltage between said positive and negative bias potentials in response to a sensed potential failure condition.

5. The circuitry of claim 4 wherein the first and second switching means comprises first and second switching transistors to apply positive and negative control voltages to the base input and the control means renders both said switching transistors nonconductive to neutrally bias said base input of said power transistor.

6. The circuitry of claim 4 where the sensing means comprises a current sensor for sensing current flow through the transistor and deactivating said switching means if an overcurrent condition is sensed.

7. The circuitry of claim 4 wherein the sensing means comprises a voltage sensor for monitoring operation of the transistor and deactivating the switching means if an overvoltage condition is sensed.

8. Apparatus comprising:
   a power transistor having a base control input for controlling conduction of said transistor by contolling an emitter base junction voltage;
   a PNP switching transistor having a collector electrically coupled to the base of said power transistor and an emitter coupled to a positive voltage source so that when said PNP switching transistor conducts a positive bias signal is coupled to the base of said power transistor to turn on said power transistor;
   a NPN switching transistor having a collector electrically coupled to the base of said power transistor and an emitter coupled to a negative voltage source so that when said NPN switching transistor conducts, a negative reverse biasing signal is coupled to the base of the power transistor to turn off said power transistor; and
   failure sensing means coupled to the power transistor to sense a failure condition in said power transistor and render both said switching transistors nonconductive to apply a neutral bias to the base control input of the power transistor and render said power transistor nonconductive.

9. The apparatus of claim 8 where the failure sensing means comprises a third switching transistor to control base inputs of the first and second switching transistors and render said first and second switching transistors nonconductive if a failure condition is sensed.

* * * * *